United States Patent
Zink et al.

(10) Patent No.: US 8,931,922 B2
(45) Date of Patent: Jan. 13, 2015

(54) CERAMIC WAVELENGTH-CONVERSION PLATES AND LIGHT SOURCES INCLUDING THE SAME

(75) Inventors: Nathan Zink, North Andover, MA (US);
Madis Raukas, Lexington, MA (US);
Matthew A. Stough, Exeter, NH (US);
Yi Zheng, Lynnfield, MA (US); Alan Lenef, Belmont, MA (US)

(73) Assignee: OSRAM Sylvania Inc., Danvers, MA (US)

( * ) Notice: Subject to any disclaimer, the term of this patent is extended or adjusted under 35 U.S.C. 154(b) by 124 days.

(21) Appl. No.: 13/427,538

(22) Filed: Mar. 22, 2012

(65) Prior Publication Data

US 2013/0250544 A1    Sep. 26, 2013

(51) Int. Cl.
| | |
|---|---|
| *F21V 9/00* | (2006.01) |
| *F21V 3/00* | (2006.01) |
| *F21V 5/00* | (2006.01) |
| *F21V 9/16* | (2006.01) |
| *F21V 11/00* | (2006.01) |

(52) U.S. Cl.
USPC ......... 362/293; 362/311.03; 362/84; 362/510

(58) Field of Classification Search
USPC .......... 362/231, 341, 345, 293, 84, 510, 255, 362/311.03; 257/77, 98
See application file for complete search history.

(56) References Cited

U.S. PATENT DOCUMENTS

| | | | | |
|---|---|---|---|---|
| 7,075,116 B2 * | 7/2006 | Okazaki | ........................ | 257/98 |
| 7,554,258 B2 * | 6/2009 | Rossner et al. | ............... | 313/503 |
| 7,663,152 B2 * | 2/2010 | Bierhuizen et al. | ............. | 257/98 |
| 8,106,584 B2 * | 1/2012 | Tabuchi et al. | ................ | 313/512 |
| 8,445,929 B2 * | 5/2013 | Krames et al. | ................... | 257/98 |
| 8,552,454 B2 * | 10/2013 | Hsieh et al. | ...................... | 257/98 |
| 2008/0211386 A1 * | 9/2008 | Choi et al. | ...................... | 313/503 |
| 2009/0296367 A1 * | 12/2009 | Sekine et al. | .................... | 362/84 |
| 2010/0301360 A1 | 12/2010 | van de Ven et al. | | |
| 2011/0006316 A1 | 1/2011 | Ing et al. | | |
| 2011/0090696 A1 * | 4/2011 | Nagai et al. | .................... | 362/293 |
| 2011/0180780 A1 * | 7/2011 | Yoo et al. | ......................... | 257/13 |
| 2011/0222265 A1 | 9/2011 | Drenten et al. | | |
| 2011/0279012 A1 * | 11/2011 | Washizu et al. | ............... | 313/483 |
| 2011/0309388 A1 * | 12/2011 | Ito et al. | .......................... | 257/89 |
| 2011/0309398 A1 | 12/2011 | Ito et al. | | |
| 2012/0001204 A1 * | 1/2012 | Jagt | ................................. | 257/88 |
| 2012/0037882 A1 * | 2/2012 | Yoo et al. | ........................ | 257/13 |

FOREIGN PATENT DOCUMENTS

WO    WO 2004/068599    8/2004

OTHER PUBLICATIONS

"Thermal Conductivity of some common Materials and Gases" from http://www.engineeringtoolbox.com/thermal-conductivity-d_429.html accessed Apr. 22, 2014.*

* cited by examiner

*Primary Examiner* — Ismael Negron
*Assistant Examiner* — Erin Kryukova
(74) *Attorney, Agent, or Firm* — Robert F. Clark (57) ABSTRACT

A wavelength-conversion plate is described herein. The wavelength conversion plate may include a converter of a first ceramic material and a reflector of a second ceramic material. The first ceramic material converts the primary light emitted by a light source such as a light emitting diode (LED) into a secondary light and the second ceramic material reflects the secondary light emitted by said converter. Preferably, the converter is inlaid into the reflector so that the reflector surrounds an outer edge of the converter. Such a configuration has an advantage of reducing unwanted side emissions from the converter.

23 Claims, 6 Drawing Sheets

- 300
- 301 (YAG:Ce, 2.0% Ce)
- 301' (YAG:Ce, 1.5% Ce)
- 301'' (YAG:Ce, 1.0% Ce)
- 301''' (YAG:Ce, 0.5% Ce)
- 302 (Al2O3)

FIG. 3B

- 300
- 301 (LuAG:Ce, 1.0% Ce)
- 301' (YAG:Ce, 1.0% Ce)
- 301'' (LuAG:Ce, 0.5% Ce)
- 301''' (YAG:Ce, 0.5% Ce)
- 302 (Al2O3)

FIG. 3C

- 300
- 301 (LuAG:Ce, 1.0% Ce)
- 301' (YAG:Ce, 1.0% Ce)
- 302 (Al2O3)

CERAMIC WAVELENGTH-CONVERSION PLATES AND LIGHT SOURCES INCLUDING THE SAME

FIELD

The present disclosure generally relates solid-state light sources such as light emitting diodes (LED), and, more particularly, to a LED light sources including one or more ceramic wavelength-conversion plates.

BACKGROUND

LED chips can generate visible or non-visible light in a specific region of the light spectrum. The light output from the LED may be, for example, light in the blue, red, green, non-visible ultra-violet (UV), and/or near-UV spectral regions, depending on the material composition of the LED. When it is desired to construct an LED light source that produces a color different from the output color of the LED, it is known to convert light output from the LED having a first wavelength or wavelength range (the "primary light" or "excitation light") to light having a second wavelength or wavelength range (the "secondary light" or "emission light") using photoluminescence.

Photoluminescence generally involves absorbing higher energy primary light with a wavelength-conversion material such as a phosphor or mixture of phosphors. Absorption of the primary light can excite the wavelength-conversion material to a higher energy state. When the wavelength-conversion material returns to a lower energy state, it emits secondary light, generally of a different wavelength/wavelength range than the primary light. The wavelength/wavelength range of the secondary light can depend on the type of wavelength-conversion material used. As such, secondary light of a desired wavelength/wavelength range may be attained by proper selection of wavelength-conversion material. This process may be understood as "wavelength down conversion," and an LED combined with a wavelength-conversion structure that includes wavelength-conversion material, such as phosphor, to produce secondary light, may be described as a "phosphor-converted LED" or "wavelength-converted LED."

In a known configuration, an LED die such as a III-nitride die is positioned in a reflector cup package and a volume, and a conformal layer or thin film of or including wavelength-conversion material is deposited directly on the surface of the die. In another known configuration, the wavelength-conversion material may be provided in a solid, self-supporting flat structure, such as a ceramic plate, single crystal plate or thin film structure. Such a plate may be referred to herein as a "wavelength-conversion plate." The plate may be attached directly to the LED, e.g. by wafer bonding, sintering, gluing, etc. This configuration may be understood as "chip level conversion" or "CLC." Alternatively, the plate may be positioned remotely from the LED by an intermediate element. Such a configuration may be understood as "remote conversion."

Depending on the desired far-field pattern of the light output from any chip plus converter configuration, one drawback associated with wavelength-conversion plates may be that a certain amount of light can escape through the sides of the converter during the conversion process (side emission). Side emission can result in reduced efficacy and/or inhomogenous light distribution with respect to angle. Also, the heat generated during any conversion process can reduce efficacy of the system, particularly in instances where a wavelength-conversion plate is used in high brightness/power applications.

In some applications, the side emission issue has been addressed by casting a ceramic in silicone layer around the sides of the conversion plate. For example, a $TiO_2$ in silicone casting may be formed by mixing $TiO_2$ powder into silicone, and then disposing the resulting material around an LED chip and a wavelength-conversion plate. The silicone in the cast material may then be cured to create a solid reflecting layer around the emitting surface of the wavelength-conversion plate. As a result, only the top surface of the wavelength-conversion plate may be exposed to emit light. Light emitted to the side of the conversion material is reflected by the reflecting material.

Although this solution can effectively address side emission, it requires ceramic in silicone layers to be individually cast around the wavelength-conversion plate used in each lamp package. This can add to the complexity of the lamp manufacturing process. In addition, the ceramic in silicone material may be overfilled during casting, causing it to cover a portion of the top surface of the wavelength-conversion plate and potentially reduce light output. Conversely, the ceramic in silicone material may be under filled during casting, leaving areas where side emission from the wavelength-conversion plate is still possible.

In addition to the aforementioned optical problems, the use of ceramic in silicone materials may also impose limitations on the thermal management of a system into which it is incorporated. For example, in systems where a significant amount of heat is generated (e.g., high power/brightness applications), thermal breakdown of the silicone (or other organic material) in the reflecting layer may occur. Moreover, because the silicone (or other organic material) in the casting has low thermal conductivity, it may not be able to conduct sufficient heat away from the LED package and/or wavelength-conversion plate, which may result in overheating.

BRIEF DESCRIPTION OF THE DRAWINGS

Reference should be made to the following detailed description which should be read in conjunction with the following figures, wherein like numerals represent like parts.

For a thorough understanding of the present disclosure, reference should be made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient. Also, it should be understood that the phraseology and terminology used herein is for the purpose of description and should not be regarded as limiting, except as otherwise expressly indicated.

DETAILED DESCRIPTION

As used herein, the term "about" when used in connection with a numerical value or range means +/−5% of the recited numerical value or range.

From time to time, one or more aspects of the present disclosure may be described using a numerical range. Unless otherwise indicated herein, any recited range should be interpreted as including any iterative values between indicated endpoints, as if such iterative values were expressly recited. Such ranges should also be interpreted as including any and all ranges falling within or between such iterative values and/or recited endpoints, as if such ranges were expressly recited herein.

References to the color of a phosphor, LED or conversion material refer generally to its emission color unless otherwise specified. Thus, a blue LED emits a blue light, a yellow phosphor emits a yellow light and so on.

One aspect of the present disclosure relates to wavelength-conversion plates that include a ceramic conversion material and a ceramic reflecting material. As will be discussed in detail below, such wavelength-conversion plates may provide one or more advantages over existing wavelength-conversion plates that utilize ceramic in silicone (or other organic material) as a reflecting material to address side emission.

Figure 1A:
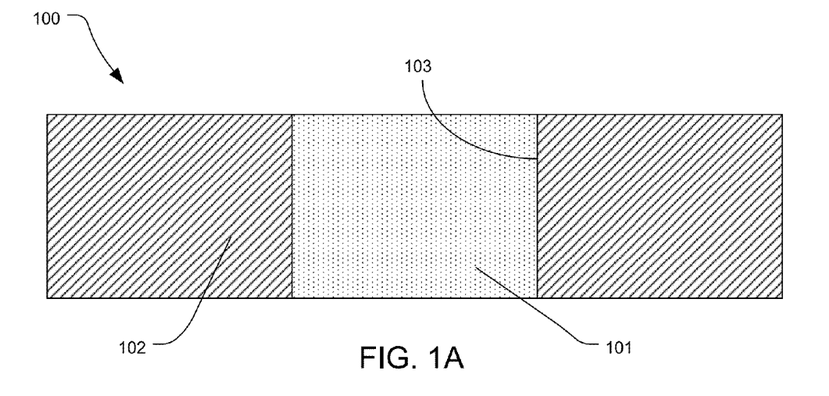
FIGS. 1A to 1C diagrammatically illustrate in cross section exemplary wavelength-conversion plates consistent with the present disclosure.
Figure 1B:
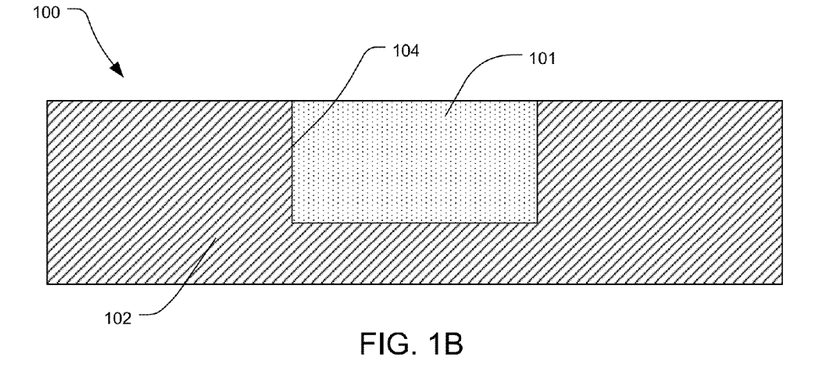
Figure 1C:
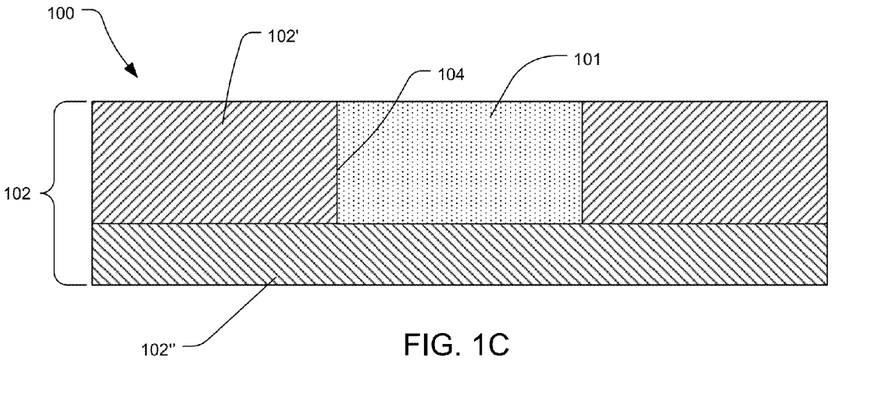

In this regard, reference is made to FIGS. 1A to 1C, which illustrate non-limiting examples of wavelength-conversion plates in accordance with the present disclosure. As shown in each figure, wavelength-conversion plate 100 includes converter 101 and reflector 102.

Converter 101 may be made of any ceramic material capable of converting primary light to secondary light (hereinafter referred to as a "conversion material"). In particular, converter 101 can include one or more conversion materials for achieving a desired wavelength-conversion, including but not limited to yellow phosphor, green phosphor, red phosphor, and/or combinations thereof. Non-limiting examples of conversion materials include oxyfluorates, nitrides (including oxynitride phosphors), and oxide phosphors (for example aluminate garnets, silicates etc.), including those containing cerium, gadolinium, gallium, scandium, europium, and/or other elements. In some embodiments, the conversion materials are chosen from cerium-activated yttrium aluminum garnets (YAG:Ce), cerium-activated yttrium gadolinium aluminum garnets (YGdAG:Ce), cerium-activated lutetium aluminum garnets (LuAG:Ce), cerium-activated lutetium gallium aluminum garnets (LuGAG:Ce), europium- or cerium-activated alkaline earth (AE) silicon oxynitride (AE-SiON:Eu, where AE designates at least one element selected from Ba, Sr, and Ca), europium- or cerium-activated metal-SiAlON (M-SiAlON, where M is chosen from alkali ions, rare earth ions, alkaline earth ions, Y, Sc, and combinations thereof), and the like. Dopant elements such as cerium or europium may be understood to be 'activators' of the conversion material (i.e., the elements largely responsible for the light absorption and emission in the conversion material), and are referred to as such in this application. In one non-limiting embodiment, converter 101 is selected from $(Y_{2.94}Ce_{0.06})Al_5O_{12}$, $(Y_{2.94}Ce_{0.006}Gd_{0.45})Al_5O_{12}$, $(Lu_{2.97}Ce_{0.03})Al_5O_{12}$, combinations thereof, and the like. Such materials may be arranged in a desired distribution and/or pattern within converter 101.

In non-limiting preferred embodiments, converter 101 is formed entirely of ceramic material, i.e., converter 101 does not include non-ceramic materials. In other terms, converter 101 may consist or consist essentially of ceramic material, such as but not limited to the previously identified ceramic materials.

Reflector 102 may be made from any ceramic material having suitable optical and/or thermal properties, such as high reflectance (particularly for secondary light), desirable thermal conductivity, and/or high temperature resistance. For convenience, such materials are referred to herein as "reflecting materials." Non-limiting examples of reflecting materials that may be used to form reflector 102 include ceramics such as aluminum oxide ($Al_2O_3$), yttrium, lutetium and other aluminum garnets (YAG, LuAG etc.), titanium dioxide ($TiO_2$), barium aluminate ($BaAl_2O_4$), yttrium oxide ($Y_2O_3$), zirconium oxide ($ZrO_2$), aluminum nitride (AlN), combinations thereof, and the like. In some embodiments, the reflecting material is $Al_2O_3$.

The reflecting materials when sintered may have a reflectance ranging from greater than or equal to about 80%, such as greater than or equal to about 85%, greater than or equal to about 90%, greater than or equal to 95%, or even greater than or equal to 99%. Preferably, reflector 102 exhibits reflectance within the aforementioned values/ranges for the secondary light emitted by converter 101. In some embodiments, reflector 102 is completely or partially formed from materials that are transmissive to primary light, but which are reflective to secondary light. Such materials may be used to form a dichroic filter in which a narrow range of wavelengths define a cutoff between transmission above and reflection below, or vice versa.

In non-limiting preferred embodiments, reflector 102 is formed entirely of ceramic material, i.e., reflector 102 does not include non-ceramic materials. In other terms, reflector 102 may consist or consist essentially of ceramic material, such as but not limited to the previously identified ceramic materials.

FIG. 1A illustrates one exemplary configuration of wavelength-conversion plate 100, in which converter 101 is positioned in through hole 103 in reflector 102. While through hole 103 is depicted as having a platelet (e.g., substantially circular shape), it should be understood that through hole 103 may have any geometric or irregular shape. For example, through hole 103 may be in the shape of a circle, an oval, a square, a rectangle, a triangle, etc. In some embodiments, through hole 103 has a size and shape that substantially matches the size and shape of an LED package with which wavelength-conversion plate 100 may be utilized. The converter 101 is coupled to the reflector 102 at least in part by its interaction with the surface of through hole 103 which forms the interface between the converter 101 and reflector 102. Preferably, as shown in FIG. 1A, the reflector 102 abuts the converter 101 over the entirety of the interface between the reflector 102 and the converter 101.

Converter 101 may be processed or otherwise configured to fit within through hole 103. In such embodiments, the position of converter 101 within through hole 103 may be maintained by mechanical compression between the edges of converter 101 with adjacent portions of reflector 102. Alternatively or additionally, the position of converter 101 may be maintained by a physical and/or chemical bond between the edges of converter 101 and adjacent portions of reflector 102.

Although not necessary, a layer of an adhesive or other bonding agent may also be used to maintain the position of converter 101 within through hole 103. Preferably, no such adhesive or bonding agent is used. But if used, such adhesive or bonding agent may transmit greater than or equal to 80%, about 85%, about 90%, or even about 95% of the primary and/or secondary light in the system. Alternatively or additionally, such adhesive or bonding agent may reflect greater than or equal to about 80%, about 85%, about 90%, or even about 95% of the primary and/or secondary light in the system. Moreover, the adhesive or bonding agent, if used, may be selected to have a high thermal conductivity. In such embodiments, all or a portion of the interior edges of through hole 103 may be in direct contact with the outer edges of converter 101.

FIG. 1B illustrates an alternative exemplary configuration of a wavelength-conversion plate in accordance with the present disclosure. In this instance, reflector 102 includes recess 104 in a surface thereof. In some embodiments, recess 104 may be a region of reflector 102 that has a thickness less than the maximum thickness of reflector 102. However, a region of reduced thickness is not required. For example, recess 104 may be formed by laminating or otherwise coupling reflector 102 containing a through hole to/with another material. In any case, recess 104 may be formed using a wide variety of processes, such as stamping, imprinting, embossing, etching, abrading, cutting, etc. of a green article and/or precursor containing the reflecting material prior to consolidation of the article/precursor, e.g., by sintering or another thermal process.

Recess 104 is shown in FIG. 1B as having a generally u-shaped cross section. It should be understood that recess 104 may have any desired shape or configuration. For example, recess 104 may have a rectangular, circular, oval, oblong, triangular, trapezoidal, pentagonal, and/or irregular shape. In some embodiments, recess 104 is sized and shaped so that it substantially matches the size and shape of an LED package with which wavelength-conversion plate may be utilized. As shown in FIG. 1B, the recess 104 is a rectangular cuboid with the surfaces of the sides and bottom forming the interface with converter 101.

Like the conversion material in FIG. 1A, converter 101 in FIG. 1B may be processed or otherwise configured to fit within recess 104 of reflector 102, e.g., as an inlay. In such instances, the position of converter 101 within recess 104 may be maintained by mechanical compression between the edges of converter 101 and portions of reflector 102 that form walls 105 of recess 104. Alternatively or additionally, the position of converter 101 within recess 104 may be maintained by a physical and/or chemical bond between converter 101 and adjacent portions of reflector 102.

As in the embodiment shown in FIG. 1A, a layer of an adhesive or bonding agent may also be used to maintain the position of converter 101 within recess 104, though use of such an agent is not required. Preferably, no such adhesive or bonding agent is used. But if used, such adhesive or bonding agent may have a high thermal conductivity and may transmit greater than or equal to 80%, about 85%, about 90%, or even about 95% of the primary light and/or secondary light. Alternatively or additionally, such adhesive or bonding agent may reflect greater than or equal to about 80%, about 85%, about 90%, or even about 95% of the primary and/or secondary light in the system. In such embodiments, all or a portion of the interior surfaces the walls of recess 104 may be in direct contact with corresponding outer edges of converter 101.

Recess 104 in FIG. 1B has been discussed above and illustrated as being bounded entirely by a single reflector 102. However, it should be understood that different materials may be used to form the bottom portion or either side of recess 104. For example, as shown in FIG. 1C, the reflector 102 may be divided into two parts 102' and 102". A first ceramic material may be used in upper part 102' to form the sides of recess 104, and a second ceramic material may be used in the lower part 102" to form the bottom portion of recess 104. The first and second ceramic materials may be the same or different. For example the first material may include one or more reflective materials such as the ceramics discussed above in connection with reflective material 102, whereas the second material may include a different ceramic material.

Therefore in some embodiments, a recess may be formed by punching (or drilling) a through hole in an upper reflector part 102', and laminating the punched reflecting material on another material layer forming the lower reflector part 102". In such embodiments, recess 104 would be bounded by the sides of the through hole in the upper reflector part 102' and a surface of the other material layer forming lower reflector part 102". The other material layer may include a ceramic material that is the same or different from the ceramic material used to form upper reflector part 102'. Alternatively or additionally, the other material layer of lower reflector part 102" may be formed by one or more layers of metallic and/or dielectric materials.

In any case, the material forming the lower reflector part 102" may be configured to transmit primary light (e.g., emitted by an LED), and to reflect secondary light emitted by converter 101. That is, the lower reflector part 102" may be configured to transmit greater than about 80% of incident primary light (such as greater than or equal to about 85%, about 90%, about 95%, about 99%, or even 100% of incident primary light), while reflecting greater than or equal to about 80% of secondary light emitted by converter 101 (such as greater than or equal to about 85%, about 90%, about 95%, about 99%, or even about 100% of secondary light). In this regard, a portion of the lower reflector part 102" may be configured as a dichroic filter, a thin film filter, a thin film metal reflector, an interference filter, and the like.

While the above disclosure has focused on wavelength-conversion plates that include a single conversion material, multiple conversion materials may be used. In this regard, reference is made to FIG. 2, which illustrates an exemplary wavelength-conversion plate 200 that includes multiple converters 201, 201', 201" disposed within through holes/recesses 203, 203', 203" in reflecting material 202. In each case, the reflector 202 surrounds the outer edges of converters 201, 201', 201". Conversion materials 201, 201', 201" may be formed of the same or different ceramic material, such as the exemplary ceramics noted above with respect to converter 101. In some embodiments, conversion materials 201, 201', 201" are formed from different materials that emit secondary light in different regions of the electromagnetic spectrum. For example, conversion materials 201, 201', and 201" may be configured to emit secondary light in the white (e.g., YGdAG: Ce), green (LuAG:Ce), and yellow (YAG:Ce) regions of the visible spectrum, respectively. Similarly, reflector 202 may include one or more of the ceramic materials noted above with respect to reflector 102. In some embodiments, reflector 202 is YAG.

Figure 2:
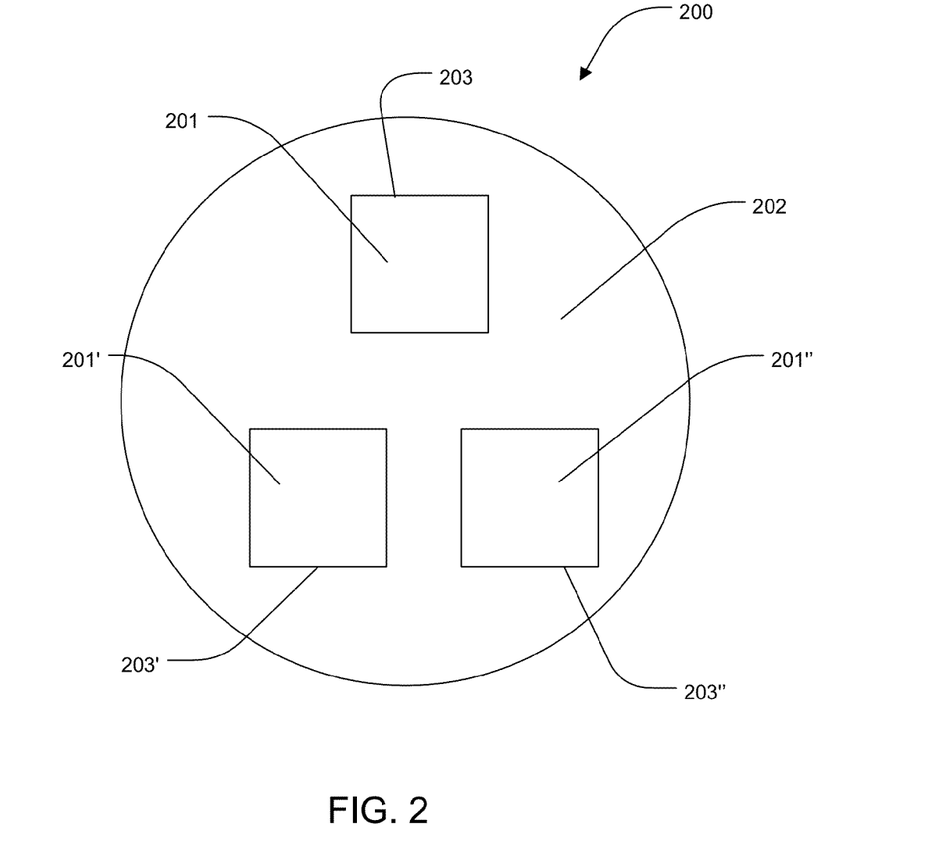
FIG. 2 diagrammatically illustrates a top view of an exemplary wavelength-conversion plate including multiple converters, consistent with the present disclosure.

As may be appreciated, wavelength-conversion plate 200 may be used as a color wheel in a light engine, such as an LED light engine. As used herein, the term LED light engine means a set of LED chips that are mounted on a common substrate, so as to form a unified light source. That is, it may be used to provide selected conversion of primary light into secondary light of a desired wavelength, e.g., by rotating the plate such that the primary light is incident on one or more of converters 201, 201', and/or 201".

Figure 3A:
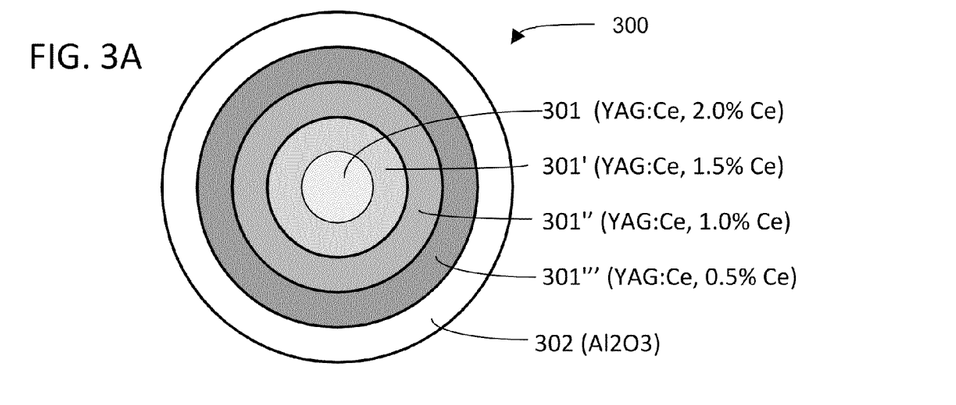
FIGS. 3A to 3C diagrammatically illustrate top views of additional exemplary wavelength-conversion plates in accordance with the present disclosure.
Figure 3B:
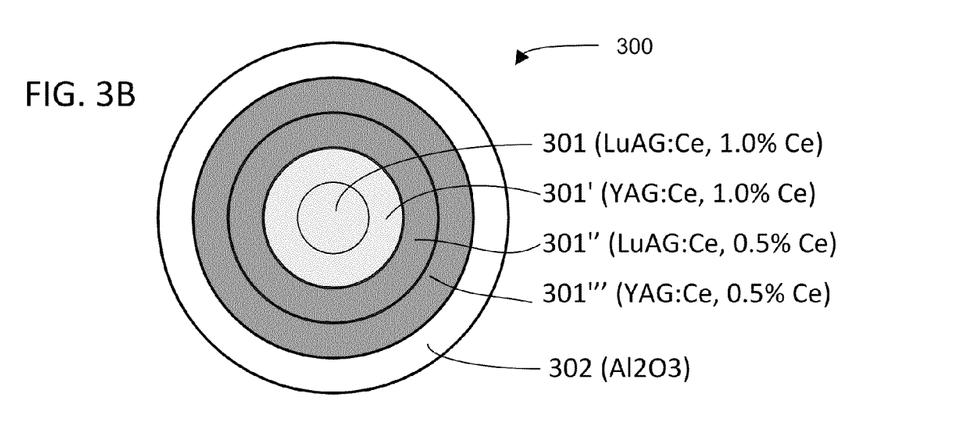
Figure 3C:
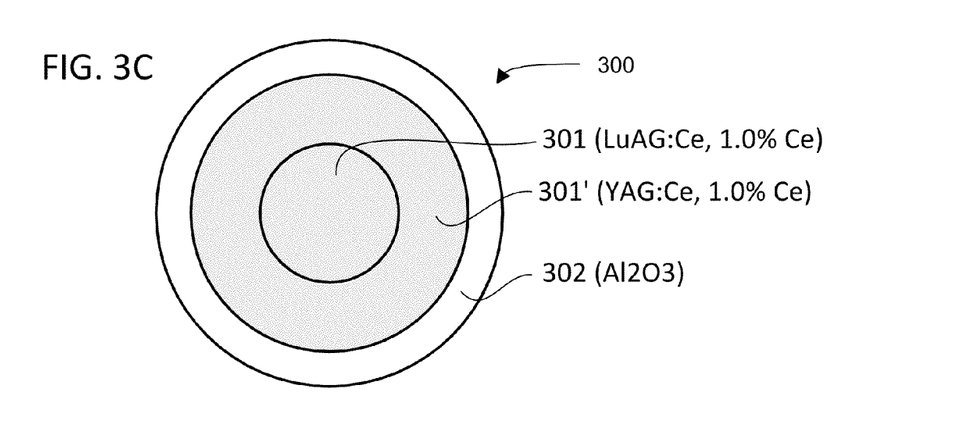

FIGS. 3A-3C depict additional exemplary wavelength-conversion plates in accordance with the present disclosure. As shown in each of these figures, wavelength-conversion plates 300 may include multiple regions of conversion material. For clarity, such regions are labeled in FIGS. 3A-3C as region 301, 301', 301'', 301''', etc. As further depicted, each region may contain conversion material that is of the same or different type as an adjacent region, and which may be of the same or different activator concentration as an adjacent region. In FIG. 3A, for example, region 301 is YAG:Ce containing 2 atomic % Ce as an activator, region 301' is YAG:Ce containing 1.5 atomic % Ce as an activator, region 301'' is YAG:Ce containing 1.0 atomic % of Ce as an activator, and region 301''' is YAG:Ce containing 0.5 atomic % of Ce as an activator. FIG. 3B depicts a wavelength-conversion plate in which region 301 is LuAG:Ce containing 1.0 atomic % Ce as an activator, region 301' is YAG:Ce containing 1.0 atomic % Ce as an activator, region 301'' is LuAG:Ce containing 0.5 atomic % Ce as an activator, and region 301''' is YAG:Ce containing 0.5 atomic % Ce as an activator. And in FIG. 3C, region 301 is LuAG:Ce containing 1.0 atomic % Ce as an activator, and region 301' is YAG:Ce containing 1.0 atomic % Ce as an activator. In each of FIGS. 3A-3C, the regions of conversion material may be surrounded by a reflecting material 302, which for the sake of illustration is shown as $Al_2O_3$.

As may be appreciated from FIGS. 3A-3C, the wavelength-conversion plates of the present disclosure can include a converter in which the composition of one or more ceramic materials varies relative to a set position in the converter plate. For example, the converter plates described herein may be formed such that the composition of the ceramic conversion material periodically or gradually changes in activator concentration, activator type and/or in other chemical (elemental) constituents over a defined region. As shown in FIG. 3A, the activator concentration in a ceramic conversion material may gradually decrease from the center of the converter, or vice versa. In other words, a gradient of conversion material concentration may be established, relative to the center of wavelength-conversion plate 300. Alternatively or additionally, the nature of the conversion material may vary with location, as shown in FIGS. 3B and 3C.

While FIGS. 3A-3C depict embodiments in which regions of conversion material take the form of concentric rings or cylinders of more or less the same width, other configurations are also possible. For example, regions 301, 301', etc. may be configured to have the same or different width as an adjacent region. Wavelength-conversion plates with fewer or greater regions of conversion material than those depicted in FIGS. 3A-3C are also possible. Indeed, wavelength-conversion plates with about 1 to about 100 regions, such as about 2 to about 50, about 2 to about 20, about 2 to about 10, or even about 2 to about 5 regions of conversion material are envisioned by the present disclosure.

Similarly, the activator concentrations specified in FIGS. 3A-3C should be considered exemplary only. The concentration of each region may be tailored, e.g., to provide a desired level of conversion and/or to provide other desirable properties, such as spectral color, level of light scattering, and the like. In some embodiments, the activator concentration may range from greater than 0 to about 5 atomic % or more, such as greater than 0 to about 2.5 atomic %, about 0.5 to about 2 atomic %, or even about 0.5 to about 1 atomic %.

In addition, the materials identified in FIGS. 3A-3C should be considered exemplary only. Regions 301, 301', etc. may be manufactured from any of the conversion materials specified herein, including those specified above for conversion material 101. Likewise, reflecting material 302 may be formed from any of the reflecting materials described herein, including those specified above for reflecting material.

As may be appreciated from the above, the present disclosure contemplates wavelength-conversion plates that eliminate the need for embedding the converter plate in a reflective silicone. Because the ceramics used in the reflecting material may be highly heat conductive and degradation resistant, the wavelength-conversion plates described herein may be suitable for high brightness/power applications which may not be possible using silicone reflectors. Moreover, the reflector used in the wavelength-conversion plates described herein may have high thermal conductivity, which may enhance thermal management by providing alternative mechanisms for dissipating heat.

For example, in instances where reflector 102 is manufactured from a ceramic, the reflector may have a thermal conductivity equal to or approaching that of the thermal conductivity of the pertinent bulk ceramic. In some embodiments, the reflectors described herein exhibit a thermal conductivity ranging from about 25% or more, such as about 50% or more, about 85% or more, about 95% or more, or even about 99% or more of the thermal conductivity of the corresponding bulk ceramic. In some embodiments, the thermal conductivity of the reflectors described herein is equal to the thermal conductivity of the corresponding bulk ceramic. With this in mind, bulk aluminum oxide ($Al_2O_3$) has a thermal conductivity of about 25 to 45 W/m-K (Watts per meter Kelvin), yttrium aluminum garnet (YAG) has a bulk thermal conductivity of about 13 W/m-K, zirconium oxide ($ZrO_2$) has a bulk thermal conductivity of about 1 to 2 W/m-K, aluminum nitride (AlN) has a bulk thermal conductivity of about 70-120 W/m-K, and titanium oxide ($TiO_2$) has a bulk thermal conductivity of about 11-13 W/m-K Put in other terms, the reflectors described herein may exhibit a thermal conductivity ranging from about 5 to about 35 W/m-K, such as about 8 to about 30 W/m-K, about 11 to about 25 W/m-K, or even about 12 to about 20 W/m-K. Of course, reflectors exhibiting thermal conductivities falling within, above, or below such ranges may be used, and are contemplated herein.

In contrast, when ceramic powders are dispersed in silicone, the resulting material can have a thermal conductivity less than 1 W/m-K, or even less than about 0.5 W/m-K. In this regard, the thermal conductivity of a ceramic in silicone material may be estimated from the thermal conductivity and density of the matrix (silicone) and filler (e.g., ceramic particles), as well as the filler loading. By way of example, ceramics such as YAG may have a thermal conductivity over about 13 W/m-K, and a density of about 4 g/cm$^3$. The silicone matrix may have a thermal conductivity of about 0.17 W/m-K and a density of about 1.0 g/cm$^3$. From these factors, the calculated thermal conductivity of a YAG/silicone reflector may range from 0.15 W/m-K (0 weight % YAG particles) to about 0.375 W/m-K (60 weight % YAG particles).

Accordingly, the reflectors in accordance with the present disclosure may exhibit a thermal conductivity that is significantly higher than that of a ceramic in silicone. Indeed the reflectors described herein may exhibit a thermal conductivity that is greater than or equal to about 1.5-100 times the thermal conductivity of a corresponding ceramic in silicone, such as about 5 to about 95, about 10 to about 90, about 15 to about 75, about 20 to about 65, or even about 25 to about 50 times the thermal conductivity of a corresponding ceramic in silicone. As used herein, the term "corresponding ceramic in silicone" means a ceramic in silicone that contains ceramic particles of the same composition as the ceramic(s) used to form the reflectors described herein.

The reflectors described herein may also exhibit desirable temperature resistance. That is, the reflectors described herein may be capable of operating at temperatures ranging from about −40° C. to about 300° C. As may be appreciated, the maximum service temperature of the lighting devices described herein may exceed the temperature at which the matrix of a ceramic in silicone would degrade.

The wavelength-conversion plates described herein can also enable the production of conversion plates that are constructed or otherwise formulated to provide desired optical properties in a particular environment. As shown in FIGS. 3A-3C, the wavelength-conversion plates described herein can include multiple regions of conversion material. Each region may be formulated to provide desired performance in the optical environment in which it is located. The regions may be formed as a plurality of nested concentric cylinders as shown in FIGS. 3A-3C. The conversion materials of each region may be made of a different conversion material or have a different activator concentration. For example, the conversion materials of FIG. 3A each have a different Ce activator concentration and are arranged such that the Ce concentration decreases when progressing from the innermost region 301 to the outermost region 301'''.

In instances where the wavelength-conversion plate is to be used in connection with a light source that produces excitation light in a focused beam of high optical density that impinges on a particular region of wavelength-conversion plate 300, e.g., region 301. In such instances, region 301 may be formulated to include desired conversion materials at an appropriate concentration to provide a desired level of conversion to secondary light.

One example of the use of multi-conversion level conversion materials is the control of color versus angle from two-dimensional conversion surfaces. Primary light may be directionally emitted from an LED source, and therefore may traverse the conversion material layer at angles other than normal (i.e., other than perpendicular to the two-dimensional plane of the conversion material layer). Primary light traversing at high angle may be absorbed more strongly and converted to secondary light. By tailoring the activator content of in the converter plate to coincide with the incident angle of primary light emitted by a light source, a desired level of primary to secondary light conversion can be achieved.

In addition, color rings or stripes may appear in the far field of an illumination system. The conversion plates described herein can address or modify this effect by affecting the probability of primary light absorption in outer, larger angle directions. This can give primary light impinging on these regions the same or similar probability of absorption or transmission as inner, smaller angle direction primary light traversing the conversion material.

The wavelength-conversion plates of the present disclosure may be manufactured using a variety of methods. For example, the wavelength-conversion plates may be produced by spin-coating, slip or tape casting, injection molding, extrusion, or another deposition technique so as to form a green (i.e., 'non-sintered') conversion plate having a desired conformation. In some embodiments, one or a combination of such methods may be used to form a green conversion plate of the configuration shown in FIGS. 1A-1C, and/or 2, wherein a conversion material is disposed within a through hole or recess of a reflecting material. Alternatively or additionally, such methods could be used to manufacture a green conversion plate of the configuration shown in FIGS. 3A-3C, wherein rings or other periodic structures containing conversion material are formed and surrounded by a green reflecting material.

Once formed, the green conversion plate may be thermally processed, e.g., via sintering, to produce a wavelength-conversion plate in which the ceramic conversion materials and ceramic reflecting materials individually or collectively reach full or substantially full density. "Full density" is used herein to refer to the density of the bulk material having the same composition. Substantially full density means greater than or equal to about 92% of full density, such as about 93%, about 94%, about 95%, about 96%, about 97%, about 98%, or even about 99% of full density. Thus, for example, if a green wavelength-conversion plate includes YAG:Ce as a ceramic conversion material, sintering or otherwise heat treating the green wavelength-conversion plate to full density means that the plate is treated such that the density of the YAG:Ce in the sintered article is the approaching the density of bulk YAG:Ce.

In some embodiments, sintering or other thermal processing may cause the ceramic conversion and reflecting materials to melt, diffuse into, or otherwise fuse with one another at their respective interfaces. Similarly, such processing may cause the ceramic conversion and reflecting materials to form a boundary in which the ceramic conversion material may flow into interstices in the ceramic reflecting material, and vice versa.

The ceramics in the conversion and reflecting materials may therefore be joined together, e.g., via mechanical compression, a physical bond, and/or a chemical bond. Alternatively or additionally, the ceramic conversion and reflecting materials may form, during sintering or other thermal processing, a boundary in which the ceramic conversion material is not present within the interstices of the ceramic of the reflecting material, and vice versa. In such instances, the ceramic conversion material may be retained in a through hole/recess in the ceramic reflecting material only by mechanical compression.

For example, a fully sintered converter may be inserted into a through hole or recess in a partially sintered ceramic reflector. Thermal processing of the reflector/converter combination would cause further sintering and shrinkage of the reflector resulting in a compressive force being applied to the converter whereby it becomes fixed within the through hole or recess.

The temperature at which sintering or other thermal processing may occur may depend on the ceramic materials used as the conversion material and the reflecting material. In some embodiments, green articles containing ceramic conversion material and ceramic reflecting material may be co-sintered at a temperature ranging from about 1300° C. to about 2000° C., such as about 1400° C. to about 1800° C., about 1500° C. to about 1750° C., or even about 1600° C. to about 1725° C. Of course, sintering temperatures above, below, and between the aforementioned ranges may also be used, and are contemplated by the present disclosure.

As may be appreciated from the above, sintering or other thermal processing of the green articles described herein may form a wavelength-conversion plate that is manufactured entirely from inorganic materials, i.e., an "all ceramic" or "composite ceramic" wavelength-conversion plate. In such instances, the ceramic conversion material may have a solid border of ceramic reflecting material around its edges, e.g., as shown in FIG. 1A. In instances where the conversion material is disposed within a recess in the second ceramic tape, sintering or other thermal processing may result in a ceramic converter plate in which a ceramic reflecting material frames the sides and bottom of a ceramic conversion material, e.g., as shown in FIG. 1B.

In either instance, the reflecting frame or border of the wavelength-conversion plates described herein may exhibit high backscattering reflectance, the nature and amount of which may depend on the ceramic material used. In optically isotropic materials such as yttrium aluminum garnet (YAG)

and its variants, for example, scattering of secondary light emitted by the conversion material may result from pores and/or secondary phases in the reflecting material. In optically anisotropic materials such as aluminum oxide ($Al_2O_3$), the ceramic may contain randomly oriented grains of different refractive indices. As a result, light may scatter at the grain boundaries of such materials.

In either case (optically isotropic or optically anisotropic materials), one property of interest is the scattering length, i.e., the average distance light must travel within the reflecting material before it is scattered. Scattering length may be directly related to the density of scatterers, their scattering cross section, and/or index anisotropy. To provide desirable optical confinement of secondary light emitted by the conversion material, the region of backscattering of the reflecting material may be significantly smaller than the corresponding dimensions of the reflecting material. In some embodiments, most of the backscattering of secondary light may take place over a few scattering lengths. In such instances, the scattering length of the reflecting material (e.g., the thickness/width of reflector 102 in FIGS. 1A-1C) may be less than or equal to about one order of magnitude smaller than the lateral dimensions of the conversion material.

Figure 4A:
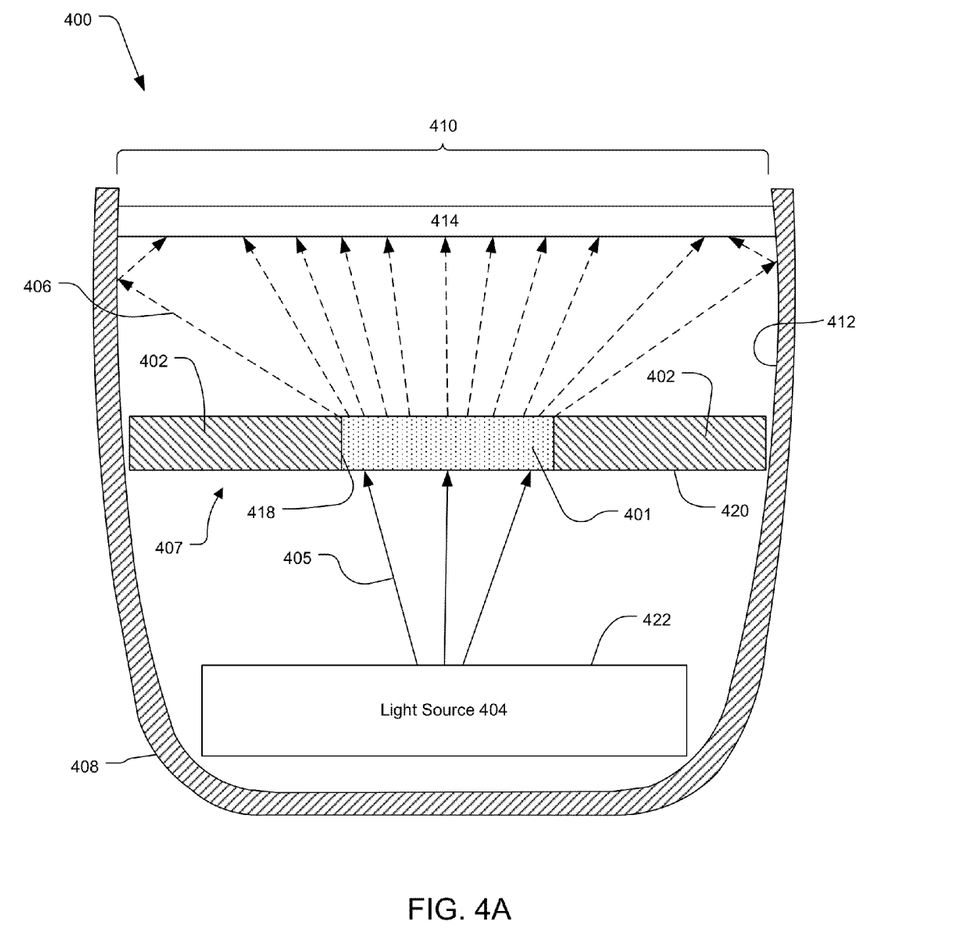
FIGS. 4A and 4B diagrammatically illustrate in cross section exemplary devices that include a wavelength-conversion plate consistent with the present disclosure.

Another aspect of the present disclosure relates to lighting devices that include at least one of the wavelength-conversion plates described herein. FIG. 4A illustrates an exemplary configuration of such a lighting device. As shown, device 400 includes light source 404 and wavelength-conversion plate 407 disposed within housing 408. In this embodiment, wavelength-conversion plate 407 includes converter 401 disposed within a through hole 418 in reflector 402. The lower surface 420 of wavelength-conversion plate 407 is shown in FIG. 4A as being oriented generally in parallel with a light emitting (upward facing) surface 422 of light source 404. Such orientation is not required, however, and light source 404 and wavelength-conversion plate 407 may be oriented in any suitable manner. Furthermore, while light source 404 and wavelength-conversion plate 407 are shown as having respective upper and lower surfaces that are smooth, it should be understood that such surfaces may be roughened, structured, etc., depending on the desired optical out-coupling and in-coupling.

Light source 404 may be any light source capable of emitting primary light. Non-limiting examples of such light sources include solid state sources such as LEDs (e.g., nitride III-V LEDs such as an InGaN LED) and laser diodes. Preferably, the light source 404 is a blue or UV LED or laser diode. More preferably, the light source 404 is a blue LED or laser diode that emits in a wavelength range from 420 nm to 490 nm, or even more preferably 450 nm to 475 nm. In any case, the light source(s) used in the lighting devices described herein may be coupled to a light guide (e.g., a light pipe) to form a surface emitter. Furthermore, while device 400 is shown as including a single light source 404, it should be understood that the lighting devices described herein may include an array of light sources.

In operation, light source 404 may emit primary light (indicated by arrows 405) described by a number of parameters such as a peak or dominant wavelength, color coordinates, intensity etc. The primary light emitted by light source 404 may be incident on the lower surface 420 of converter 401 of wavelength-conversion plate 407. Converter 401 may absorb the primary light and be excited to a higher energy state. When the excited converter 401 returns to a lower energy state, it may emit secondary light (indicated by arrows 406). In this way, primary light incident on converter 401 may be converted to secondary light.

Converter 401 may be configured to have a desired level of conversion efficiency, i.e., to convert a desired amount of incident primary light to secondary light. In some embodiments, converter 401 exhibits a conversion efficiency greater than or equal to 50%, such as about 50 to about 100%, about 60 to about 99%, about 70 to about 98%, about 80 to about 97%, or even about 85 to about 96%. Preferably, the conversion efficiency of converter 401 is greater than 95%.

As explained above, reflector 402 can function to reflect incident primary and/or secondary light. With respect to the former, reflector 402 may reflect incident primary light in such a way that it is incident on and or passes through converter 401. In this way, reflector 402 can increase the opportunity for converter 401 absorb and convert primary light to secondary light, thus increasing conversion efficiency.

Secondary light emitted by converter 401 may not always be emitted toward aperture 410 of housing 408. For example, secondary light may be emitted to either side of converter 401 (side scatter) or back towards light source 404 (backscatter). If such side scattered and back scattered light is not redirected towards the aperture, it may be absorbed or otherwise lost, resulting in a loss of light output from device 400. In this regard, reflecting material may be configured to have high reflectance with respect to secondary light that is emitted by converter 401, as discussed above. In the embodiment shown in FIG. 4A, for example, reflector 402 is disposed around the edge(s) of converter 401. As a result, reflector 402 may reflect side scattered secondary light emitted by converter 401, thus increasing the opportunity for such light to escape device 400. A multilayer interference coating can be applied to the lower surface 420 of conversion plate 407 which would allow the primary light 405 to pass into the converter 401 and reflect secondary light 406 emitted by the converter 401 back in the direction of aperture 410.

Figure 4B:
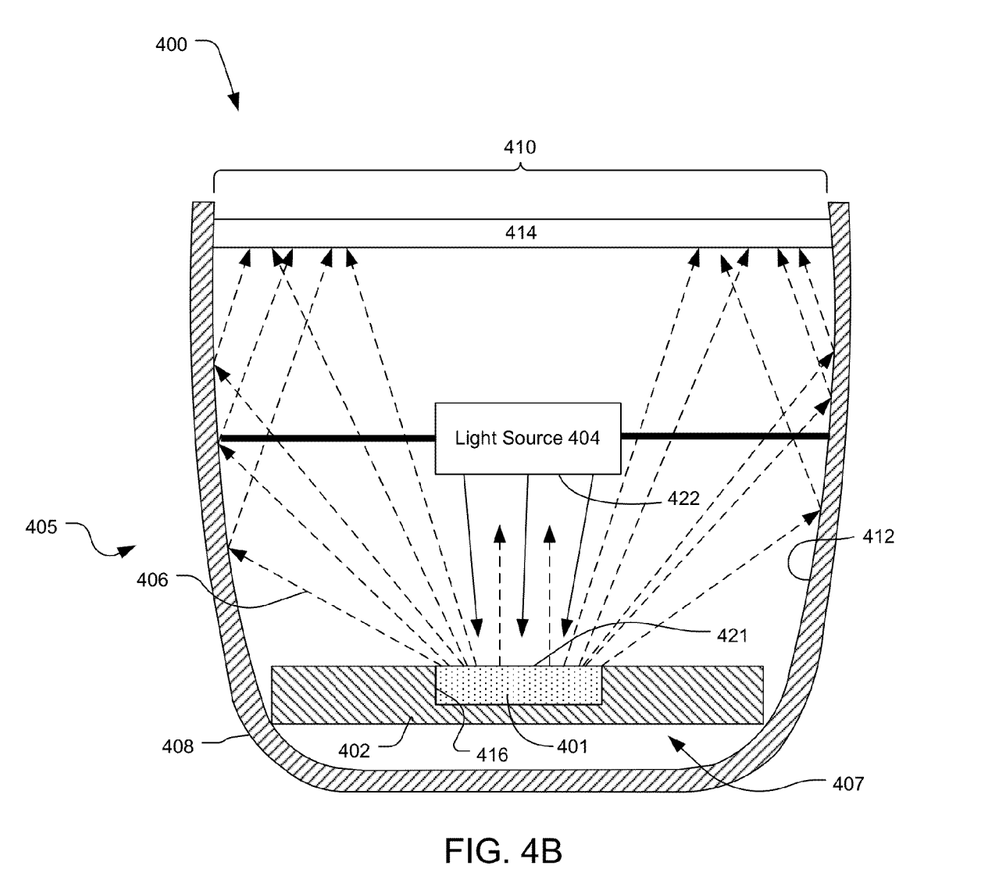

FIG. 4B illustrates another exemplary lighting device configuration in accordance with the present disclosure. With the exception of the location of wavelength-conversion plate 407 and light source 404, the parts of device 400 in FIG. 4B are identical to those shown in FIG. 4A. Thus, the nature and function of such common parts is not repeated. Of course, it should be understood that this illustration is exemplary only, and light source 404 and wavelength-conversion plate 407 may be oriented in any desired fashion.

In FIG. 4B, wavelength-conversion plate 407 is configured such that converter 401 is disposed within a recess 416 in reflector 402. As such, only one surface of converter 401 is exposed to light from light source 404. In this embodiment the exposed surface 421 of converter 401 is oriented to face a light emitting surface 422 of light source 404. As a result, secondary light emitted by converter 401 may be emitted in a direction other than the direction of aperture 410 of device 400, e.g., towards light source 404.

To address this issue, device 400 can include a secondary reflector 412, which may be integral to or separate from housing 408. In FIGS. 4A and 4B, secondary reflector 412 is integral to housing 408. Thus, for example, secondary reflector 412 may take the form of one of or more reflective coatings disposed on an interior surface of housing 408. Secondary reflector 412 may be configured to reflect light such that a desired illumination pattern, such as a down light, flood light, etc., may be emitted from device 400. Secondary reflector 412 may also be configured to re-direct backscattered primary and/or secondary light in a desired manner. For example, secondary reflector 412 may include a surface having high reflectivity for backscattered primary and/or secondary light.

Converter 401 may be positioned away from light source 404 (as shown in FIGS. 4A and 4B) or it may be positioned on the light emitting surface 422 of light source 404. In any case, converter 401 may be formed separately from light source 404, and coupled in a known manner to light source 404 so that light emitted from light source 404 can interact with converter 401.

If converter 401 is positioned at a distance from light source 404, it may be supported within the housing 408 by any means, including support from a portion of a housing 408. Positioning converter 401 a distance from the light source 404 can allow converter 401 to be formed into a shape that is different from the surface of the light source 404. For example, converter 401 may be in the form of a plate, a dome, or a shell. In any case, the surfaces of converter 401 may be planar, concave, convex, ellipsoidal, irregular, another shape, or a combination thereof.

For simplicity, device 400 has been depicted in FIGS. 4A and 4B as including relatively few parts. However, it should be understood that the lighting devices of the present disclosure may include other components and electronics that are commonly found in solid state lighting devices such as LED lamps. By way of example, device 400 is shown as including diffuser 414, which may serve to diffuse the secondary light emitted by converter 401, as well as unconverted primary light.

Figure 5:
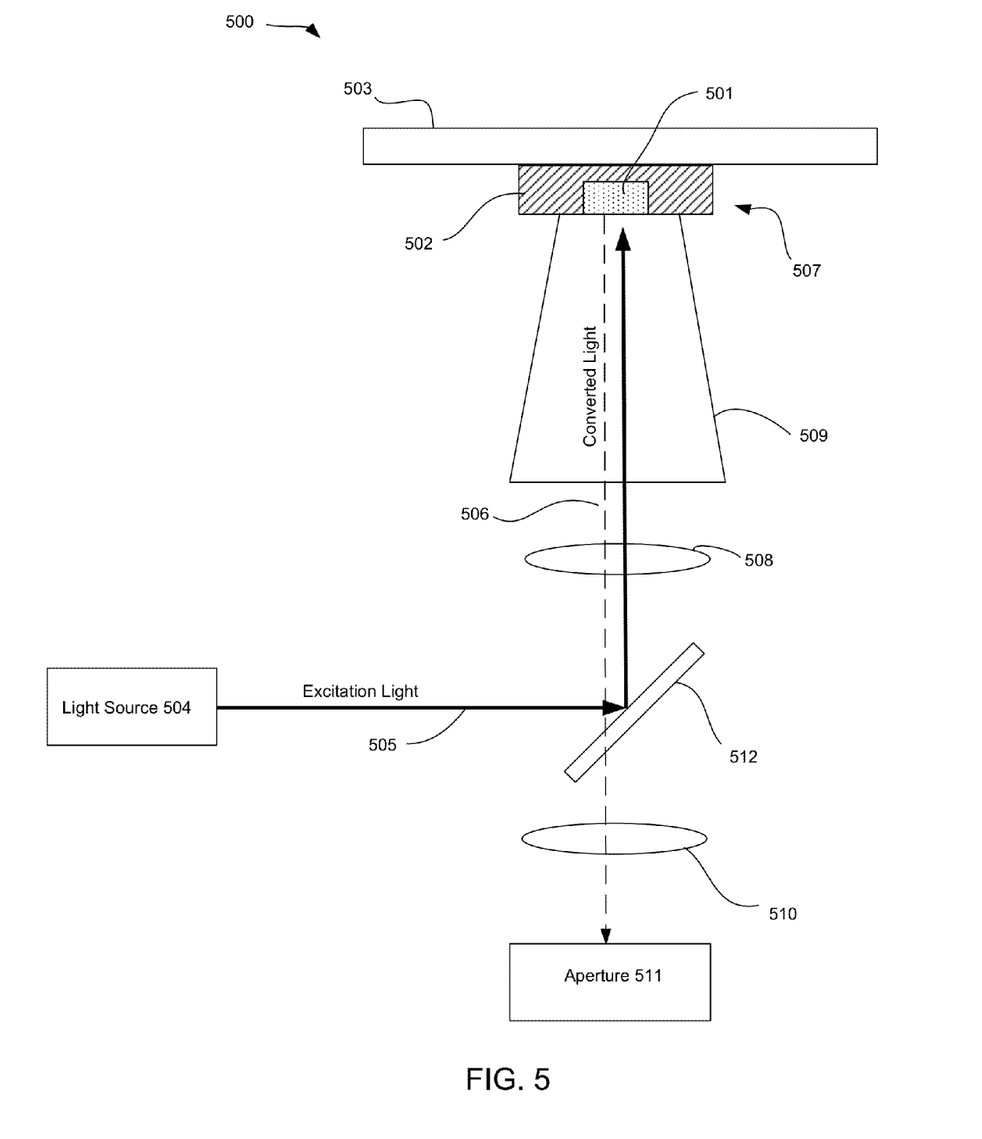
FIG. 5 diagrammatically illustrates a light activated remote phosphor system including a wavelength conversion plate consistent with the present disclosure.

FIG. 5 illustrates a non-limiting example of a remote phosphor system 500 in accordance with the present disclosure. As shown, system 500 includes a wavelength-conversion plate 507 including converter 501 disposed within a recess in reflector 502. The wavelength-conversion plate 507 (shown in cross section) is coupled to heat-sink 503. As may be understood, heat-sink 503 functions to remove heat generated by the wavelength-conversion plate as it converts primary light to secondary light.

System 500 further includes light source 504. Light source 504 can exhibit a substantially collimated excitation light output 505. Thus, for example, light source 504 may be a collimated lamp, an LED, a laser, or the like (e.g., a laser diode) that emits excitation light 505 at a desired power. Excitation light 505 may be, for example, laser light having any wavelength suitable to excite converter 501 at average power levels of about 1-100 W or more, as required. Excitation light 505 emitted by light source 504 may impinge on dichroic beam splitter 512, where it is reflected through focusing optic/lens 508 to impinge on converter 501. Converter 501 can absorb excitation light and emit secondary light 506.

As described above, converter 501 typically emits secondary light in all directions, including to its sides and rear. Reflector 502 may contain and reflect such secondary light such that it is redirected in a direction generally towards focusing optic/lens 508. In any case, the bulk of secondary light emitted by converter 501 is contained by collection/concentrating optic 509. As may be thus understood, collection/concentrating optic 509 may have high confinement for the secondary light. As a result, collection/concentrating 509 may limit or otherwise prevent the loss of secondary light 506.

Secondary light 506 may be collimated as it passes through focusing optic/lens 508. All or a portion of the secondary light 506 may then pass through dichroic beam splitter 512, which is preferably transparent (or transmits) 100% of secondary light 506. The secondary light may then be further modified by focusing lens/concentrator 510. At that point, secondary light 506 may enter an aperture of a device, e.g., a spectrometer, secondary reflector optics, fiber optic coupler, optical modulator, data projector engine or the like.

The wavelength-conversion plates of the present disclosure may provide numerous advantages. For example, because the wavelength-conversion plates described herein may be formed entirely of a ceramic material, they may exhibit high temperature resistance. As a result, they may be capable of functioning at higher operating temperatures than conventional wavelength-conversion plates that include organic material such as silicone, i.e., above about 150° C.

In addition, the wavelength-conversion plates of the present disclosure may open new pathways for thermal management, particularly in instances where the reflecting material is composed entirely of inorganic materials such as the ceramics specified above. Specifically, the reflector material itself may provide a convective pathway for heat generated during the conversion process, which can allow use of the wavelength-conversion plates described herein in high temperature and/or brightness applications.

Finally, the optical properties of the conversion material and the reflecting material may be controlled by adjusting processing parameters such as particle size and particle size distribution during the formation of the wavelength-conversion plates described herein. As a result, wavelength-conversion plates that are tailored to a particular application may be easily made using the processes described herein.

Another aspect of the present disclosure relates to a wavelength-conversion plate. The wavelength-conversion plate may include a converter and a reflector coupled thereto. The converter may include a first ceramic material capable of converting incident primary light to secondary light. The reflector may include a second ceramic material capable of reflecting secondary light emitted by the converter. The wavelength-conversion plate may also include an interface between the converter and the reflector. In some embodiments, the second ceramic material abuts the first ceramic material over at least about 50% of said interface, such as about 75% of said interface, or even about 100% of said interface. For the sake of clarity, it is noted that the term "abut" is used herein to refer to the touching of two adjacent surfaces.

A further aspect of the present disclosure relates to co-sintered ceramic wavelength conversion plates. Such plates can include a converter and a reflector. The converter may include at least one first ceramic material, and the reflector may include at least one second ceramic material. The reflector may also include at least one through hole or recess. The converter and the reflector may be co-sintered such that the reflector engages and retains the converter within the at least one through hole or recess.

A further aspect of the present disclosure relates to a device. The device includes a light source capable of emitting primary light, and a wavelength-conversion plate in accordance with the present disclosure. In some embodiments, the device includes a wavelength-conversion plate that includes a converter and a reflector coupled thereto. The converter may include a first ceramic material capable of converting incident primary light to secondary light. The reflector may include a second ceramic material capable of reflecting secondary light emitted by the converter. The wavelength-conversion plate may also include an interface between the converter and the reflector. In some embodiments, the second ceramic material abuts the first ceramic material over at least about 50% of said interface, such as about 75% of said interfaced, or even about 100% of said interface.

While the principles of the present disclosure have been described herein, it is to be understood by those skilled in the art that this description is made only by way of example and not as a limitation as to the scope of the claimed invention. The features and aspects described with reference to particular embodiments disclosed herein are susceptible to combination and/or application with various other embodiments described herein. Such combinations and/or applications of such described features and aspects to such other embodiments are contemplated herein. Modifications and other embodiments are contemplated herein and are within the scope of the present disclosure.

What is claimed is:

1. A wavelength-conversion plate, comprising:
a solid, self-supporting flat structure having a reflector and a plurality of substantially fully dense, sintered ceramic converters, said converters comprising a ceramic material capable of converting incident primary light to a secondary light, wherein each converter is different from every other converter with regard to its ceramic material or an activator concentration of its ceramic material and said converters have a form of nested concentric cylinders;
said reflector surrounding said converters and comprising a substantially fully dense, sintered ceramic material capable of reflecting secondary light emitted by said converters, said converters being inlaid into said reflector; and
an interface between at least one converter and said reflector, wherein said reflector abuts said at least one converter and said converters are retained by said reflector without use of an adhesive or bonding agent.

2. The wavelength-conversion plate of claim 1, wherein said ceramic material of said converters is selected from a cerium-activated yttrium aluminum garnet (YAG:Ce), a cerium-activated yttrium gadolinium aluminum garnet (YGdAG:Ce), a cerium-activated lutetium aluminum garnet (LuAG:Ce), a cerium-activated lutetium gallium aluminum garnet (LuGAG:Ce), a europium-activated alkaline earth (AE) silicon oxynitride (AE-SiON:Eu), and a europium-activated metal-SiAlON (M-SiAlON:Eu), where M is selected from a group consisting of alkali ions, rare earth ions, alkaline earth ions, Y, Sc and combinations thereof.

3. The wavelength-conversion plate of claim 1, wherein said ceramic material of said reflector is selected from aluminum oxide ($Al_2O_3$), yttrium aluminum garnet (YAG), titanium dioxide ($TiO_2$), barium aluminate ($BaAl_2O_4$), yttrium oxide ($Y_2O_3$), zirconium oxide ($ZrO_2$), aluminum nitride (AlN) and combinations thereof.

4. The wavelength-conversion plate of claim 1, wherein said reflector reflects greater than or equal to about 80% of said secondary light.

5. The wavelength-conversion plate of claim 1, wherein said reflector comprises a through hole or recess, and said converters are disposed within said through hole or recess.

6. The wavelength conversion-plate of claim 5, wherein said reflector comprises one through hole.

7. The wavelength-conversion plate of claim 5, wherein said reflector comprises one recess.

8. The wavelength-conversion plate of claim 1, wherein said reflector exhibits a thermal conductivity ranging from about 5 to about 35 W/m-K.

9. The wavelength-conversion plate of claim 1 wherein said reflector is comprised of an upper reflector part and a lower reflector part.

10. The wavelength-conversion plate of claim 9 wherein said upper reflector part and said lower reflector part are comprised of different ceramic materials.

11. The wavelength-conversion plate of claim 9 wherein said upper reflector part has a through hole and said lower reflector part is laminated to said upper reflector part to form a recess bounded in part by said through hole.

12. The wavelength-conversion plate of claim 1 wherein each converter emits a different secondary light.

13. The wavelength-conversion plate of claim 1 wherein each converter has an activator concentration that is different from every other converter.

14. The wavelength-conversion plate of claim 13 wherein said converters are arranged in an order of decreasing activator concentration progressing from an innermost converter to an outermost converter.

15. The wavelength-conversion plate of claim 1 wherein said converters and reflector have been co-sintered to bond said converters with said reflector.

16. The wavelength-conversion plate of claim 1 wherein said converters are fixed to said reflector by a compressive force exerted by said reflector.

17. A device, comprising:
a light source capable of emitting primary light; and
a wavelength conversion plate comprising:
a solid, self-supporting flat structure having a reflector and a plurality of substantially fully dense, sintered ceramic converters, said converters comprising a ceramic material capable of converting incident primary light to a secondary light, wherein each converter is comprised of a different ceramic material or has a different activator concentration and said converters have a form of nested concentric cylinders;
said reflector surrounding said converters and comprising a substantially fully dense, sintered ceramic material capable of reflecting secondary light emitted by said converters, said converters being inlaid into said reflector; and
an interface between at least one of said converters and said reflector, wherein said reflector abuts said at least one converter and said converters are retained by said reflector without use of an adhesive or bonding agent.

18. The device of claim 17, wherein said ceramic material of said reflector is selected from aluminum oxide ($Al_2O_3$), yttrium aluminum garnet (YAG), titanium dioxide ($TiO_2$), barium aluminate ($BaAl_2O_4$), yttrium oxide ($Y_2O_3$), and combinations thereof.

19. The device of claim 17, wherein said reflector reflects greater than or equal to about 80% of said secondary light.

20. The device of claim 17, wherein said reflector comprises a through hole or recess, and said converters are disposed within said through hole or recess.

21. The device of claim 20, wherein said reflector mechanically engages said converters so as to retain said converters within said through hole or recess.

22. The device of claim 17, wherein said reflector exhibits a thermal conductivity ranging from about 5 to about 35 W/m-K.

23. The device of claim 17, wherein said light source comprises at least one light emitting diode (LED) or laser diode.

* * * * *